United States Patent
Lin

(10) Patent No.: US 9,691,915 B2
(45) Date of Patent: Jun. 27, 2017

(54) SOLAR CELL WITH ANTI-REFLECTION STRUCTURE AND METHOD FOR FABRICATING THE SAME

(71) Applicant: NATIONAL YUNLIN UNIVERSITY OF SCIENCE AND TECHNOLOGY, Douliu, Yunlin County (TW)

(72) Inventor: Jian-Yang Lin, Douliu (TW)

(73) Assignee: National Yunlin University of Science and Technology, Douliu (TW)

(*) Notice: Subject to any disclaimer, the term of this patent is extended or adjusted under 35 U.S.C. 154(b) by 17 days.

(21) Appl. No.: 14/626,551

(22) Filed: Feb. 19, 2015

(65) Prior Publication Data
US 2015/0162461 A1 Jun. 11, 2015

Related U.S. Application Data

(62) Division of application No. 13/868,871, filed on Apr. 23, 2013.

(51) Int. Cl.
| | |
|---|---|
| H01L 31/00 | (2006.01) |
| H01L 31/0216 | (2014.01) |
| H01L 31/18 | (2006.01) |
| G02B 1/11 | (2015.01) |
| G02B 5/02 | (2006.01) |
| H01L 31/0224 | (2006.01) |
| H01L 31/0236 | (2006.01) |

(52) U.S. Cl.
CPC ......... *H01L 31/02168* (2013.01); *G02B 1/11* (2013.01); *G02B 5/0226* (2013.01); *G02B 5/0294* (2013.01); *H01L 31/02366* (2013.01); *H01L 31/022425* (2013.01); *H01L 31/18* (2013.01); *Y02E 10/50* (2013.01)

(58) Field of Classification Search
CPC ................................. H01L 31/02168
See application file for complete search history.

(56) References Cited

U.S. PATENT DOCUMENTS

| | | | | |
|---|---|---|---|---|
| 6,262,359 B1* | 7/2001 | Meier | ............... | H01L 31/02242 136/255 |
| 2003/0015234 A1* | 1/2003 | Yasuno | ................. | H01L 31/068 136/249 |
| 2004/0219670 A1* | 11/2004 | Cousins | .................. | A61L 15/24 435/375 |

OTHER PUBLICATIONS

Tao et al., "Surface texturing by solution deposition for omnidirectional antireflection," 2007, Appl. Phys. Letters 91, p. 081118.*

* cited by examiner

*Primary Examiner* — Robert Vetere
(74) *Attorney, Agent, or Firm* — Muncy, Geissler, Olds & Lowe, P.C.

(57) ABSTRACT

A solar cell with an anti-reflection structure comprises a solar cell substrate, a meshed electric-conduction layer formed on one surface of the solar cell substrate, a plurality of microspheres disposed on the meshed electric-conduction layer, and a dielectric layer. The microspheres have a diameter of 0.1-50 μm. The dielectric layer is formed between the meshed electric-conduction layer and the microspheres, and has a thickness smaller than the diameter of the microspheres to make the microspheres protrude from the dielectric layer. The meshed electric-conduction layer is formed via a screen-printing method. The present invention uses the microspheres and the meshed electric-conduction layer to achieve an excellent anti-reflection effect. Further, the present invention has the advantages of a simple fabrication process and a low fabrication cost.

5 Claims, 4 Drawing Sheets

SOLAR CELL WITH ANTI-REFLECTION STRUCTURE AND METHOD FOR FABRICATING THE SAME

CROSS REFERENCE TO RELATED APPLICATIONS

This application is a Divisional of co-pending application Ser. No. 13/868,871, filed on Apr. 23, 2013, for which priority is claimed under 35 U.S.C. §120, the entire contents of which are hereby incorporated by reference.

FIELD OF THE INVENTION

The present invention relates to a solar cell, particularly to a solar cell with an anti-reflection structure and a method for fabricating the same.

BACKGROUND OF THE INVENTION

Power shortage drives many nations to develop various substitute energies, especially solar energy. Solar energy is easy to access and pollution-free. Besides, solar cells are noiseless and have a long service life. Therefore, much money has been invested in research of solar energy. Recently, many technologies have been developed to improve the utilization efficiency of incident light and enhance the photoelectric conversion efficiency, such as changing the interface material, roughening the surface or arranging an anti-reflection layer.

In addition to promoting the photoelectric conversion efficiency, reducing the fabrication cost to increase the economic profit is also a focus subject of solar cell development. The cost of solar cells can be reduced via decreasing the material cost or improving the fabrication process. The electric-conduction layer on the light-incident surface of a solar cell must be made of a material featuring transparency and electric conductibility, such as ITO (Indium Tin Oxide), which is relatively expensive. Further, the fabrication process of solar cells requires precision CVD (Chemical Vapor Deposition) equipment, which makes the fabrication cost hard to reduce.

SUMMARY OF THE INVENTION

The primary objective of the present invention is to solve the problems of high material cost and high fabrication cost in the conventional solar cell technology.

To achieve the above-mentioned objective, the present invention proposes a solar cell with an anti-reflection structure, which comprises a solar cell substrate, a meshed electric-conduction layer formed on one surface of the solar cell substrate, a plurality of microspheres disposed on the meshed electric-conduction layer, and a dielectric layer. The microspheres have a diameter of 0.1-50 µm. The dielectric layer is formed between the meshed electric-conduction layer and the microspheres, and has a thickness smaller than the diameter of the microspheres to make the microspheres protrude from the surface of the dielectric layer.

The present invention also proposes a method for fabricating a solar cell with an anti-reflection structure, which comprises steps of:

Step S1: preparing a solar cell substrate;

Step S2: using a screen-printing method to form a meshed electric-conduction layer on the surface of the solar cell substrate;

Step S3: mixing a plurality of microspheres with a volatile solution to form a mixture solution, and spraying the mixture solution on the meshed electric-conduction layer to allow the microspheres to be disposed on the meshed electric-conduction layer, wherein the microspheres have a diameter of 0.1-50 µm; and Step S4: using a spin-coating method to coat an SOD (Spin on Dielectric) material between the meshed electric-conduction layer and the microspheres to form a dielectric layer, wherein the diameter of the microspheres is greater than the sum of the thicknesses of the dielectric layer and the meshed electric-conduction layer.

The present invention is characterized in

1. Using microspheres and a dielectric layer to form an anti-reflection structure having a rugged surface to increase the efficiency of incident light utilization and the efficiency of photoelectric conversion;
2. Using a meshed electric-conduction layer to reduce the cost spent on the transparent electric-conduction material;
3. Using a screen-printing method to reduce the dependence on the CVD (Chemical Vapor Deposition) technology and decrease the cost of fabricating solar cells.

DETAILED DESCRIPTION OF THE PREFERRED EMBODIMENTS

Figure 1A:
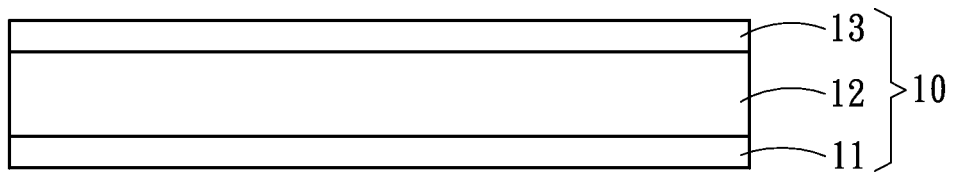
FIGS. 1A-1D schematically show the steps for fabricating a solar cell with an anti-reflection structure according to one embodiment of the present invention.

The technical contents of the present invention will be described in detail in cooperation with drawings below.

Refer to FIGS. 1A-1D. The present invention proposes a solar cell with an anti-reflection structure, which comprises a solar cell substrate 10, a meshed electric-conduction layer 20 formed on one surface of the solar cell substrate 10, a plurality of microspheres 30 disposed on the meshed electric-conduction layer 20, and a dielectric layer 40. The microspheres 30 have a diameter of 0.1-50 µm. The dielectric layer 40 is formed between the meshed electric-conduction layer 20 and the microspheres 30 and has a thickness smaller than the diameter of the microspheres 30 to allow the microspheres 30 protrude from the surface of the dielectric layer 40. The solar cell substrate 10 includes a bottom electrode 11 far away from the meshed electric-conduction layer 20, a P-type semiconductor layer 12, and an N-type semiconductor layer 13 neighboring the meshed electric-conduction layer 20, which are arranged in sequence. In one embodiment, the solar cell substrate 10 also includes an intrinsic semiconductor layer (not shown in the drawings) arranged between the P-type semiconductor layer 12 and the N-type semiconductor layer 13 to increase the photoelectric conversion efficiency. As the present invention is not focused on the solar cell substrate 10, the specification will not describe the solar cell substrate 10 in further detail. The meshed electric-conduction layer 20 provides a plurality of accommodation spaces 21 to accommodate the microspheres 30. In the embodiment shown in FIGS. 1A-1D, each accommodation space 21 accommodates one microsphere 30. In another embodiment, one accommodation space 21 can accommodate several smaller microspheres 30 if application requires it.

In one embodiment, the meshed electric-conduction layer 20 is made of a metallic electric-conduction material, such as silver or aluminum. The meshed electric-conduction layer 20 allows light to pass through the accommodation spaces 21 and reach the solar cell substrate 10 for photoelectric conversion. In one embodiment, the microspheres 30 are made of a material selected from a group consisting of silicon dioxide, silicon nitride, and aluminum oxide.

Figure 1B:
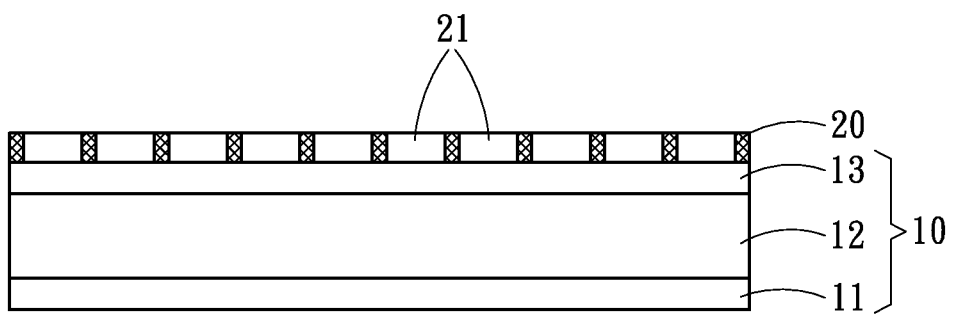
Figure 1C:
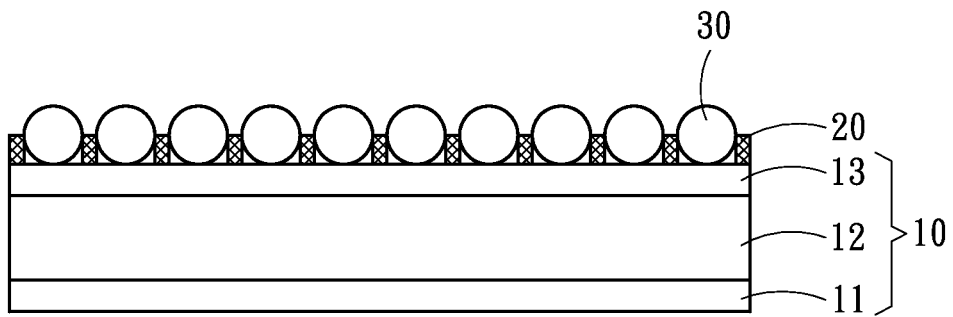
Figure 1D:
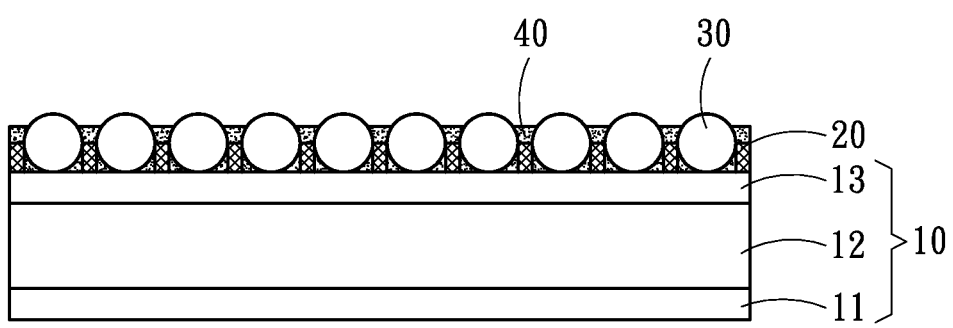
Figure 2:
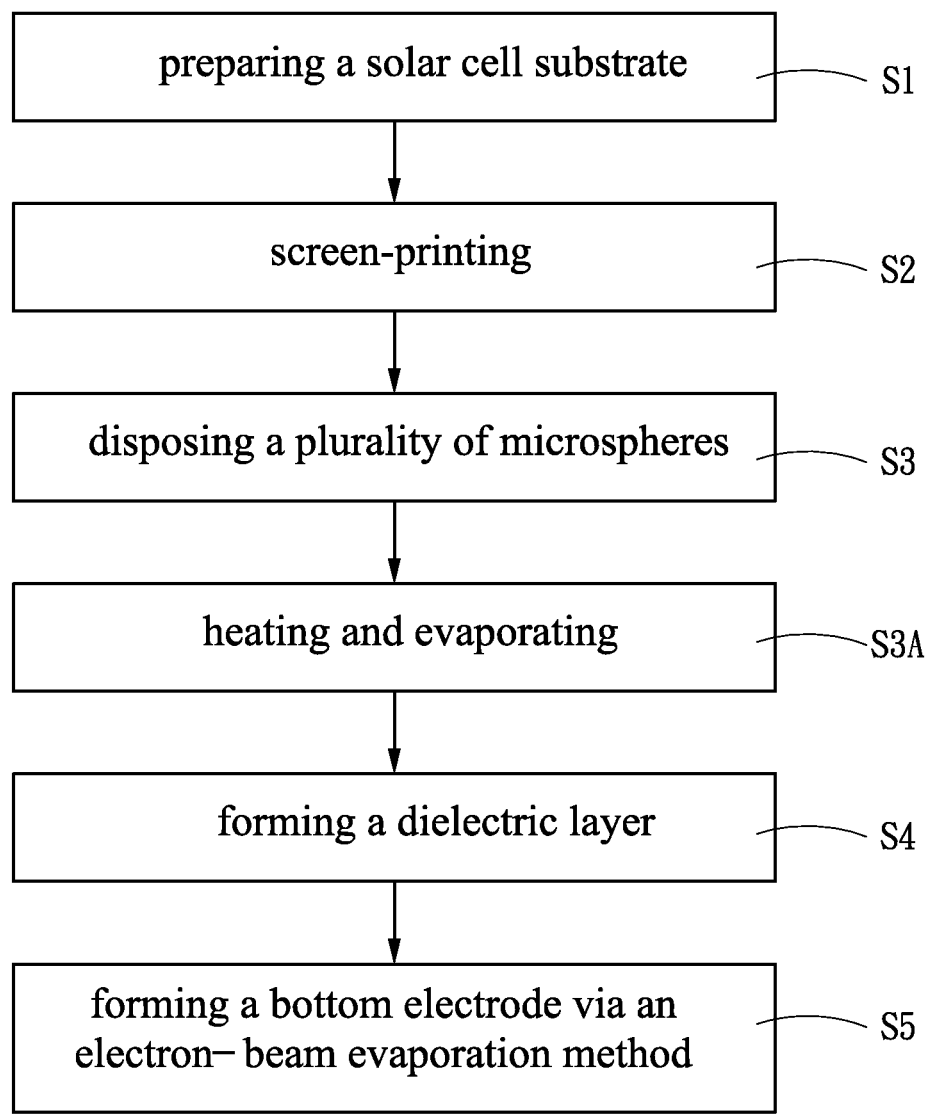
FIG. 2 shows a flowchart of a method for fabricating a solar cell with an anti-reflection structure according to one embodiment of the present invention.

Refer to FIGS. 1A-1D again, and refer to FIG. 2 also. The present invention also proposes a method for fabricating a solar cell with an anti-reflection structure, which comprises steps as follows.

Step S1—preparing a solar cell substrate 10: Firstly, wash a P-type semiconductor layer 12 via an RCA (Radio Corporation of America) clean method. Next, dope N-type ions into the P-type semiconductor layer 12 to form an N-type semiconductor layer 13, as shown in FIG. 1A. In one embodiment, an intrinsic semiconductor material is formed between the P-type semiconductor layer 12 and the N-type semiconductor layer 13 to increase the photoelectric conversion efficiency. In one embodiment, boron ion is diffused into the bottom of the P-type semiconductor layer 12 to form a back surface field. In one embodiment, P-type ion is doped into an N-type semiconductor material to form the P-type semiconductor layer 12. The fabrication of the solar cell substrate 10 can be undertaken in different ways, depending on the requirements. The embodiments described above are only to exemplify the methods for fabricating the solar cell substrate 10. The present invention does not constrain the material, structure and fabrication method of the solar cell substrate 10. As the present invention is not focused on the solar cell substrate 10, the specification will not describe the method for fabricating the solar cell substrate 10 in further detail.

Step S2—screen-printing: Use a screen-printing method to form a meshed electric-conduction layer 20 on the surface of the solar cell substrate 10, as shown in FIG. 1B. In one embodiment, the meshed electric-conduction layer 20 is made of a metallic electric-conduction material, such as silver or aluminum. The meshed electric-conduction layer 20 provides a plurality of accommodation spaces 21 to accommodate the microspheres 30.

Step S3—disposing a plurality of microspheres 30: Mix a plurality of microspheres 30 with a volatile solution to form a mixture solution, and spraying the mixture solution on the meshed electric-conduction layer 20 to allow the microspheres 30 to be disposed on the meshed electric-conduction layer 20, as shown in FIG. 1C. The microspheres 30 have a diameter of 0.1-50 μm. In one embodiment, the volatile solution is a solution containing over 0.2 wt % methanol. In one embodiment, the mixture solution is filled into an ultrasonic nebulizer, and the ultrasonic nebulizer sprays the mixture solution on the surface of the meshed electric-conduction layer 20. In this embodiment, each accommodation space 21 accommodates one microsphere 30. In the present invention, the microsphere 30 may be greater or smaller than the accommodation space 21. While the microsphere 30 is smaller than the accommodation space 21, one accommodation space 21 can accommodate several microspheres 30. In any way, the thickness of the meshed electric-conduction layer 20 must be smaller than the diameter of the microspheres 30 so that the microspheres 30 can protrude from the meshed electric-conduction layer 20.

Step S3A—heating and evaporating: Heat the solar cell substrate 10 to a temperature of 80-110° C. to make the volatile solution evaporate faster with only the microspheres 30 left on the surface of the meshed electric-conduction layer 20.

Step S4—forming a dielectric layer 40: Use a spin-coating method to coat an SOD (Spin on Dielectric) material between the meshed electric-conduction layer 20 and the microspheres 30 to form a dielectric layer 40, as shown in FIG. 1D. The diameter of the microspheres 30 is greater than the sum of the thicknesses of the dielectric layer 40 and the meshed electric-conduction layer 20. The SOD material would also be filled into the accommodation spaces 21 (shown in FIG. 1B).

Step S5—forming a bottom electrode 11 on one surface of the solar cell substrate 10, which is far away from the meshed electric-conduction layer 20, via an electron-beam evaporation method.

Figure 3:
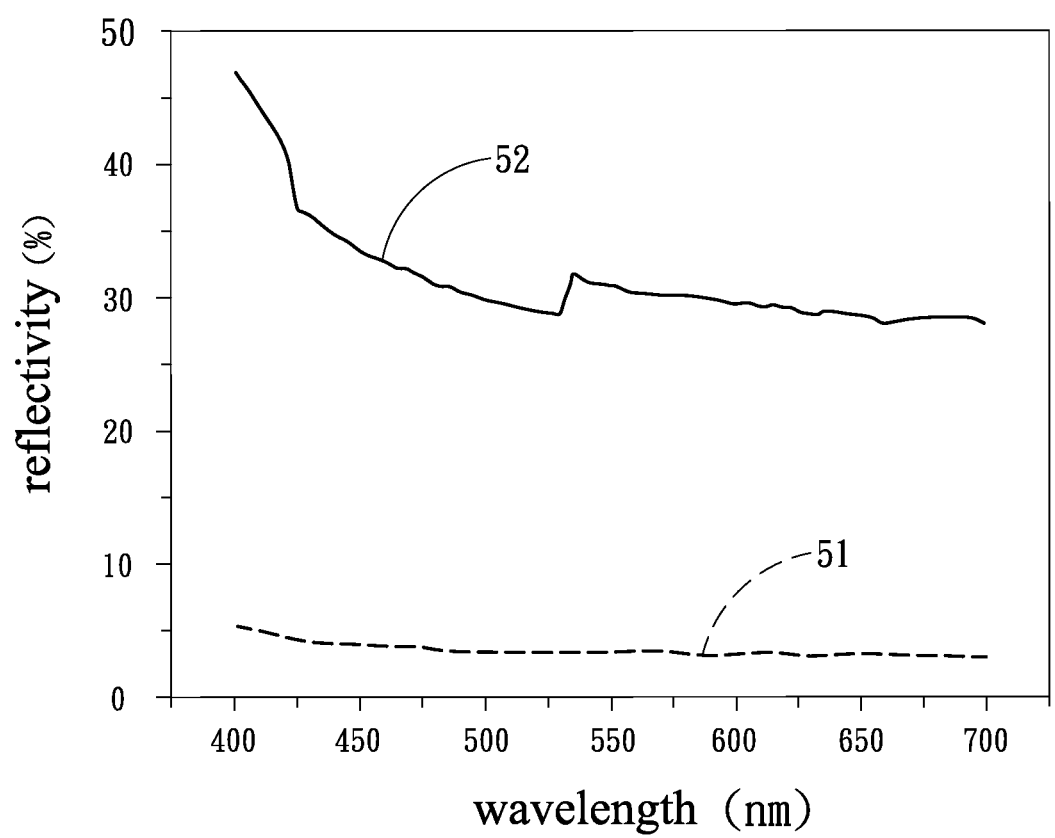
FIG. 3 shows the reflectivities of a conventional structure and an anti-reflection structure according to one embodiment of the present invention.

Refer to FIG. 3. The reflectivity of the anti-reflection structure of the present invention is expressed by Curve 51. The reflectivity of the conventional structure is expressed by Curve 52. FIG. 3 proves that the anti-reflection structure of the present invention has much lower reflectivity than the conventional structure.

In conclusion, the present invention has the following advantages:
1. The present invention uses the microspheres and the dielectric layer to form an anti-reflection structure having a rugged surface to increase the efficiency of utilizing the incident light and the efficiency of photoelectric conversion;
2. The present invention adopts a meshed electric-conduction layer to reduce the cost spent on the transparent electric-conduction material;
3. The present invention uses a screen-printing method to reduce the dependence on the CVD (Chemical Vapor Deposition) technology and decrease the cost of fabricating solar cells.

What is claimed is:
1. A method for fabricating a solar cell with an anti-reflection structure, comprising steps of:
   Step S1: preparing a solar cell substrate;
   Step S2: using a screen-printing method to form a meshed electric-conduction layer on a surface of the solar cell substrate, the meshed electric-conduction layer providing a plurality of accommodation spaces;
   Step S3: mixing a plurality of microspheres, which have a diameter of 0.1-50 μm, with a volatile solution to form a mixture solution, and spraying the mixture solution in the plurality of accommodation spaces of the meshed electric-conduction layer to allow the microspheres to be disposed on the meshed electric-conduction layer; and
   Step S4: using a spin-coating method to coat an SOD (Spin on Dielectric) material between the meshed electric-conduction layer and the microspheres to form a dielectric layer, wherein the diameter of the microspheres is greater than a sum of thicknesses of the dielectric layer and the meshed electric-conduction layer.

2. The method for fabricating the solar cell with the anti-reflection structure according to claim 1, wherein in the Step S1, N-type ions are doped into a P-type semiconductor layer to form an N-type semiconductor layer.

3. The method for fabricating the solar cell with the anti-reflection structure according to claim 1 further comprising a Step S3A: heating the solar cell substrate to a temperature of 80-110° C. to evaporate the volatile solution, wherein the Step S3A is interposed between the Step S3 and the Step S4.

4. The method for fabricating the solar cell with the anti-reflection structure according to claim 1 further comprising a Step S5: using an electron-beam evaporation method to form a bottom electrode on one surface of the solar cell substrate and on an opposite side of the meshed electric-conduction layer, wherein the Step S5 succeeds to the Step S4.

5. The method for fabricating the solar cell with the anti-reflection structure according to claim 1, wherein the microspheres are made of a material selected from a group consisting of silicon dioxide, silicon nitride, and aluminum oxide.

* * * * *